(12) United States Patent
Maebashi

(10) Patent No.: US 8,426,737 B2
(45) Date of Patent: Apr. 23, 2013

(54) ELECTRIC CONNECTION BOX

(75) Inventor: Akemi Maebashi, Kakegawa (JP)

(73) Assignee: Yazaki Corporation, Tokyo (JP)

( * ) Notice: Subject to any disclaimer, the term of this patent is extended or adjusted under 35 U.S.C. 154(b) by 641 days.

(21) Appl. No.: 12/588,751

(22) Filed: Oct. 27, 2009

(65) Prior Publication Data

US 2010/0136805 A1 Jun. 3, 2010

(30) Foreign Application Priority Data

Dec. 2, 2008 (JP) ................................ 2008-307231

(51) Int. Cl.
*H01B 17/26* (2006.01)

(52) U.S. Cl.
USPC ........................ 174/152 R; 174/50; 439/460

(58) Field of Classification Search ........................ None
See application file for complete search history.

(56) References Cited

U.S. PATENT DOCUMENTS

| | | | | |
|---|---|---|---|---|
| 1,906,829 A | * | 5/1933 | Acly ................................ | 29/887 |
| 2,397,097 A | * | 3/1946 | Forbes et al. ................. | 439/727 |
| 2,639,313 A | * | 5/1953 | Street, Jr. .................. | 174/152 R |
| 5,170,017 A | * | 12/1992 | Stanevich et al. ......... | 174/153 G |
| 5,703,325 A | * | 12/1997 | Yamaguchi et al. ............ | 174/50 |
| 5,981,877 A | * | 11/1999 | Sakata et al. ............... | 174/153 G |
| 6,248,952 B1 | * | 6/2001 | Reeves et al. ................. | 174/663 |
| 7,225,777 B2 | * | 6/2007 | Barrena et al. ............ | 123/143 C |
| 7,507,905 B2 | * | 3/2009 | Kanamaru et al. .............. | 174/50 |
| 7,586,038 B2 | * | 9/2009 | Kanamaru et al. .............. | 174/50 |
| 7,622,674 B2 | * | 11/2009 | Kanamaru et al. .............. | 174/50 |

FOREIGN PATENT DOCUMENTS

| | | |
|---|---|---|
| JP | 2000-037016 | 2/2000 |
| JP | 2006-345616 | 12/2006 |
| JP | 2007-259652 | 10/2007 |

* cited by examiner

*Primary Examiner* — Michael Zarroli
(74) *Attorney, Agent, or Firm* — Edwards Wildman Palmer LLP; James E. Armstrong, IV; Stephen D. LeBarron

(57) ABSTRACT

The electric connection box includes a case main body; a lower cover to be attached at the case main body; a harness-through opening to be structured into a cylindrical shape with the case main body and the lower cover; a wiring harness to be passed through the harness-through opening; and a water-protect elastic sheet wound around the wiring harness to be arranged in the harness-through opening. The harness-through opening has a large diameter portion, which has an inner diameter larger than an outer diameter of the part of the wiring harness wound with the water-protect sheet, and a small diameter portion, which has an inner diameter smaller than the outer diameter of the part of the wiring harness wound with the water-protect sheet.

3 Claims, 4 Drawing Sheets

ELECTRIC CONNECTION BOX

The priority application Number Japan Patent Application 2008-307231 upon which this patent application is based is hereby incorporated by reference.

FIELD OF THE INVENTION

This invention relates to an electric connection box, arranged in an engine room of a car.

BACKGROUND OF THE INVENTION

Description of the Related Art

In a car, various electronic equipments are mounted. An electric connection box, which is structured integrally with electric components, such as fuses and relays, is arranged at a suitable location between a power supply and the electronic equipments in the car for supplying electric power to the various electronic equipments.

The electric connection box may be described by the name of a junction block, a fuse block and a relay box. In this specification, the junction block, the fuse block and relay box are described with an electric connection box as a generic name hereafter. FIG. 4 is a sectional view of an electric connection box by prior art.

The electric connection box 101 shown in FIG. 4 includes a case main body 102, in which various electric components 115, 116 are mounted, a lower cover 103 to be arranged at a bottom side of the case main body 102, an upper cover to be arranged at an upper side of the case main body 102, a harness-through opening 105 formed into a cylindrical shape with the case main body 102 and the lower cover 103 when the lower cover 103 is attached on the case main body 102, a wiring harness 108 to be passed through the harness-through opening 105, and an elastic water-protect sheet 109 wound around the wiring harness 108 and arranged inside the harness-through opening 105.

The harness-through opening 105 is structured with a projection 106 projecting with a half-cylindrical shape from a lower edge of an outer wall 121 of the case main body 102, and a projection 107 projecting with a half-cylindrical shape from an upper edge of an outer wall 131 of the lower cover 103, the outer wall 131 corresponding to the outer wall 121. When the lower cover 103 is attached on the case main body 102, the projections 106 and 107 are overlapped to each other so as to form the harness-through opening 105.

The wiring harness 108 is structured by bundling a plurality of electric wires for connecting various electric components 115, 116 to be arranged at the case main body 102 and various electronic equipments mounted at the car. Outer diameter of the wiring harness 108 varies according to a type or grade of the car in which the number of electric wires is different from each. When the outer diameter of the wiring harness 108 is small, by winding the water-protect sheet 109 around the wiring harness 108, a gap to be existed between the wiring harness 108 and the harness-through opening 105 is filled so as to prevent that a liquid like a water penetrates through the gap into the case main body 102.

The electric connection box 101 is assembled by arranging a part of the wiring harness 108 wound with the water-protect sheet 109 between the projections 106, 107, and attaching the lower cover 103 on the case main body 102 so as to clamp the part wound with the water-protect sheet 109 between the projections 106, 107. Japan Patent Application Published No. 2007-259652 should be referred.

SUMMARY OF THE INVENTION

Objects to be Solved

In the electric connection box 101 by Prior Art, there is a problem as following:
At the harness-through opening 105, the part of the wiring harness wound with the water-protect sheet 109 is pressed and crushed by whole inner wall of the harness-through opening 109, so that a very large force pressing the lower cover 103 is required when the lower cover 103 is attached to the case main body 102.

According to the above problems, an object of the present invention is to provide an electric connection box, in which a cover can be attached to a case main body with a small force.
How to attain the object of the present invention In order to overcome the above problems and attain the object of the present invention, an electric connection box according to the present invention includes a case main body, a cover to be attached to the case main body, a harness-through opening to be structured into a cylindrical shape with the case main body and the cover when the cover is attached to the case main body, a wiring harness to be passed through the harness-through opening and an elastic sheet around the wiring harness to be arranged in the harness-through opening, and the harness-through opening has a large diameter portion, which has an inner diameter larger than an outer diameter of a part of the wiring harness wound with the sheet, and a small diameter portion, which has an inner diameter smaller than the outer diameter of the part of the wiring harness wound with the sheet.

In the electric connection box according to the present invention, the harness-through opening includes a cylindrical portion structuring the large diameter portion and a slant portion arranged at an inner surface of the cylindrical portion and slanting from an end of the cylindrical portion to the other end of the cylindrical portion to approach gradually toward a center of the cylindrical portion so as to structure the small diameter portion.

In the electric connection box according to the present invention, the harness-through opening includes a cylindrical portion structuring the large diameter portion and a rib projecting from an inner surface of the cylindrical portion toward a center of the cylindrical portion and extending along the cylindrical portion so as to structure the small diameter portion.

Effects of the Invention

According to the present invention, since the harness-through opening includes the large diameter portion, which has the inner diameter larger than the outer diameter of the part of the wiring harness wound with the sheet, and the small diameter portion, which has the inner diameter smaller than the outer diameter of the part of the wiring harness wound with the sheet, it can make only the small diameter portion bite the sheet so as to seal a gap between the wiring harness and the harness-through opening. Thus, the cover can be attached with a small force on the case main body of the electric connection box.

In the electric connection box according to the present invention, the harness-through opening includes the cylindrical portion structuring the large diameter portion and the slant portion arranged at the inner surface of the cylindrical portion and slanting from the end of the cylindrical portion to the other end of the cylindrical portion to approach gradually toward the center of the cylindrical portion so as to structure the small diameter portion. It can make the small diameter portion and the slant portion bite the sheet so as to seal a gap between the wiring harness and the harness-through opening. Thus, the cover can be attached with a small force on the case main body of the electric connection box.

In the electric connection box according to the present invention, the harness-through opening includes the cylindrical portion structuring the large diameter portion and the rib projecting from the inner surface of the cylindrical portion toward the center of the cylindrical portion and extending along the cylindrical portion so as to structure the small diameter portion. It can make the rib bite the sheet so as to seal the gap between the wiring harness and the harness-through opening. Thus, the cover can be attached with the small force on the case main body of the electric connection box.

The above and other objects and features of this invention will become more apparent from the following description taken in conjunction with the accompanying drawings.

DESCRIPTION OF THE PREFERRED EMBODIMENT

First Embodiment

Figure 1:
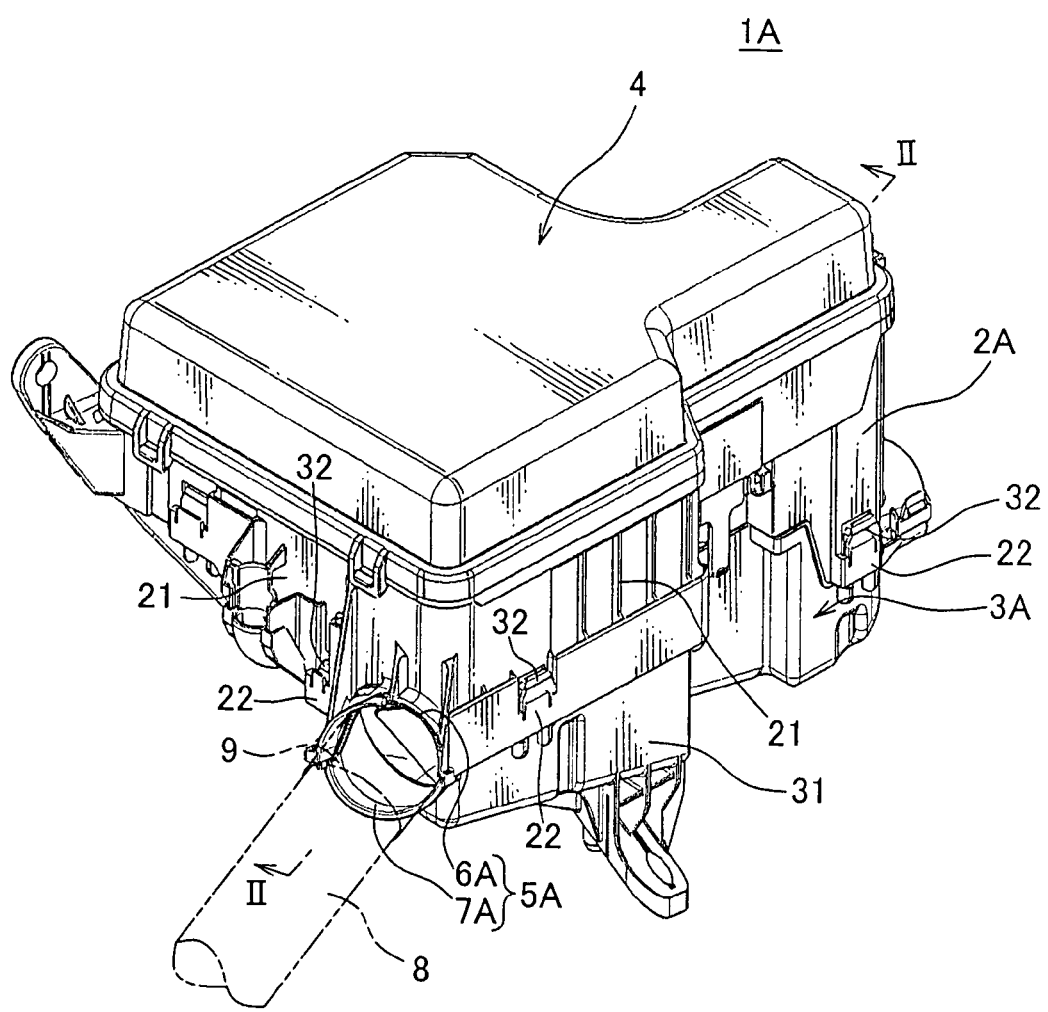
FIG. 1 is a perspective view of an electric connection box of a first embodiment according to the present invention.
Figure 2:
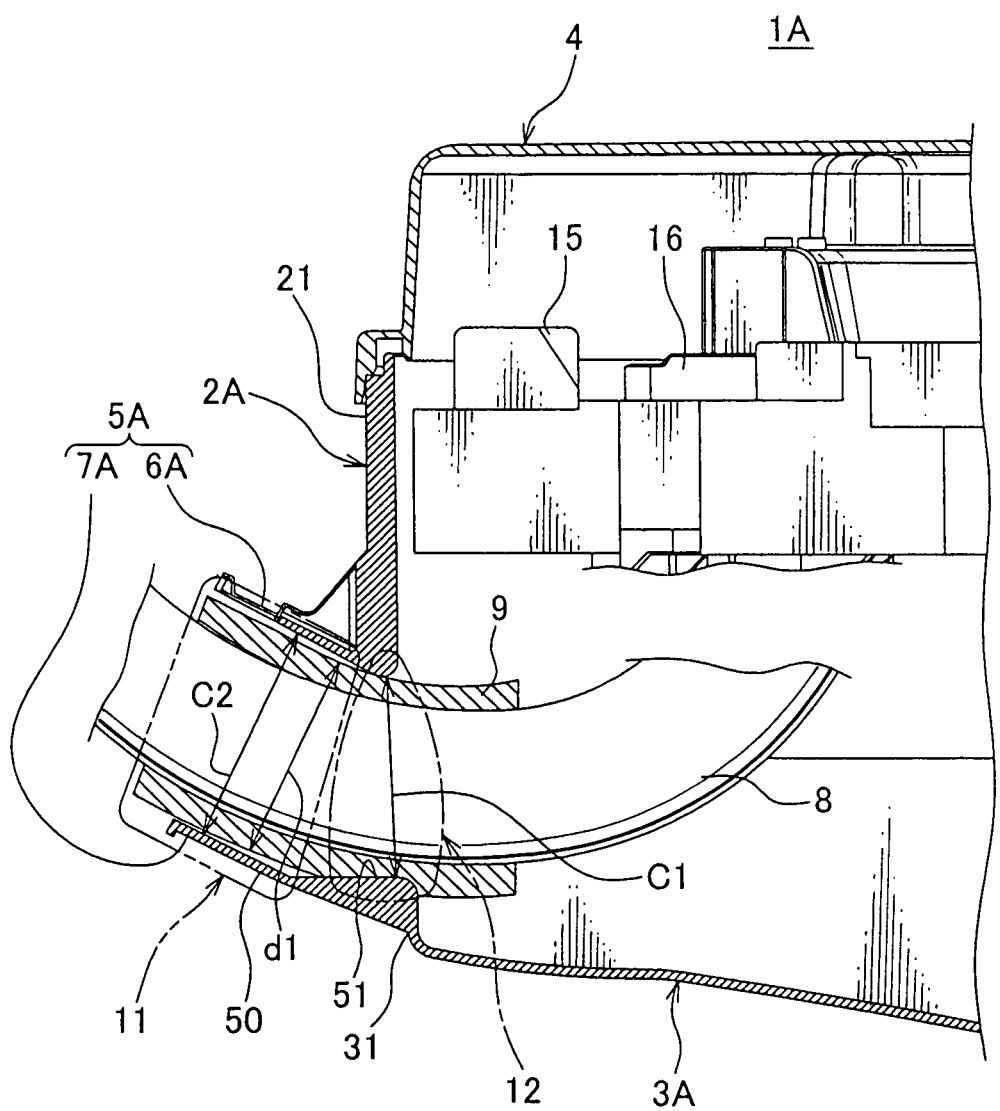
FIG. 2 is a cross-sectional view taken along the line II-II in FIG. 1.

An electric connection box of a first embodiment according to the present invention will be described with reference to FIGS. 1, 2. FIG. 1 is a perspective view of the electric connection box of the first embodiment. FIG. 2 is a cross-sectional view taken along the line II-II in FIG. 1.

The electric connection box is mounted at an engine room of a car for supplying electric power to various electronic equipments mounted at the car. In this description, a junction block, a fuse block and a relay box are called the electric connection box as a generic name.

The electric connection box 1A, as shown in FIGS. 1, 2, includes a case main body 2A, in which various electric components 15, 16 are arranged; a lower cover 3A to be attached at a bottom side of the case main body 2A; an upper cover 4 to be attached at an upper side of the case main body 2A; a harness-through opening 5A to be structured into a cylindrical shape with the case main body 2A and the lower cover 3A when the lower cover 3A is attached to the case main body 2A; a wiring harness 8 to be passed through the harness-through opening 5A and a water-protect sheet 9 as an elastic sheet wound around the wiring harness 8 to be arranged in the harness-through opening 5A. The case main body 2A, the lower cover 3A and the upper cover 4 are made of synthetic resin by injection molding.

The wiring harness 8 is formed by bundling a plurality of electric wires connecting the various electric components 15, 16 mounted at the case main body 2A and the various electronic equipments mounted at the car. Outer diameter of the wiring harness 8 varies according to a type or grade of the car in which the number of electric wires is different from each.

The water-protect sheet 9 is made of urethane foam or urethane rubber, and wound around the wiring harness 8 and arranged tightly on an inner wall of the harness-through opening 5A so as to seal a gap between the wiring harness 8 and the harness-through opening 5A. Thereby, it can be prevented that a liquid like water penetrates through the gap into the case main body 2A.

The harness-through opening 5A is structured with a projection 6A projecting with a half-cylindrical shape from a lower edge of an outer wall 21 of the case main body 2A, and a projection 7A projecting with a half-cylindrical shape from an upper edge of an outer wall 31 of the lower cover 3A, the outer wall 31 corresponding to the outer wall 21. When the lower cover 3A is attached on the case main body 2A, the projections 6A and 7A are overlapped to each other so as to form the harness-through opening 5A. The harness-through opening 5A communicates an outside of the case main body 2A and an inside of the case main body 2A.

The harness-through opening 5A has a large diameter portion 11 (shown by surrounding with a chain double-dashed line in FIG. 2), which has an inner diameter C2 larger than an outer diameter d1 of the part of the wiring harness 8 wound with the water-protect sheet 9, and a small diameter portion 12 (shown by surrounding with a dashed line in FIG. 2), which has an inner diameter C1 smaller than the outer diameter d1 of the part of the wiring harness 8 wound with the water-protect sheet 9. The outer diameter of the part of the wiring harness 8 wound with the water-protect sheet 9 correspond to an outer diameter of the wiring harness 8 added with thickness of the water-protect sheet 9.

The harness-through opening 5A includes a cylindrical portion 50 structuring the large diameter portion 11 and a slant portion 51 arranged at an inner surface of the cylindrical portion 50 and slanting from an end of the cylindrical portion 50 to the other end of the cylindrical portion 50 to approach gradually toward a center of the cylindrical portion 50 so as to structure a small diameter portion 12. Thus, the cylindrical portion 50 is formed with the projections 6A, 7A, and the slant portion 51 is arranged at the inner surface of the projection 7A. The end of the cylindrical portion 50 corresponds to an end apart from the outer wall 21, and the other end of the cylindrical portion 50 corresponds to the end nearer to the outer wall 21.

The slant portion 51 of the harness-through opening 5A structured above bites into the water-protect sheet 9 wound around the wiring harness 8 so as to press and deform the water-protect sheet 9 toward the center of the wiring harness 8. Thereby, the water-protect sheet 9 water-tightly seals a gap between the wiring harness 8 and the inner surface of the harness-through opening 5A, especially an inner surface of the small diameter portion 12.

As mentioned above, according to the present invention, by the part of the harness-through opening 5A biting the water-protect sheet 9, the gap between the wiring harness 8 and the harness-through opening 5A is sealed. Therefore, the small diameter portion 12, that is the slant portion 51, is dimensioned so as to bite the water-protect sheet 9 wound around the wiring harness 8.

The electric connection box 1A is assembled by arranging the part of the wiring harness 8 wound with the water-protect sheet 9 between the projections 6A, 7A, and attaching the lower cover 3A on the case main body 2A so as to clamp the part wound with the water-protect sheet 9 between the projections 6A, 7A. A lock receiver 22 arranged at the outer wall 21 of the case main body 2A engages with a lock arm 32 arranged at the outer wall 31 of the lower cover 3A, so that the lower cover 3A is assembled to the case main body 2A.

According to the present invention mentioned above, only by the small diameter portion 12 biting the water-protect sheet 9, the gap between the wiring harness 8 and the harness-through opening 5A can be sealed. Thereby, the lower cover 3A can be attached to the case main body 2A with a small force.

Second Embodiment

Figure 3:
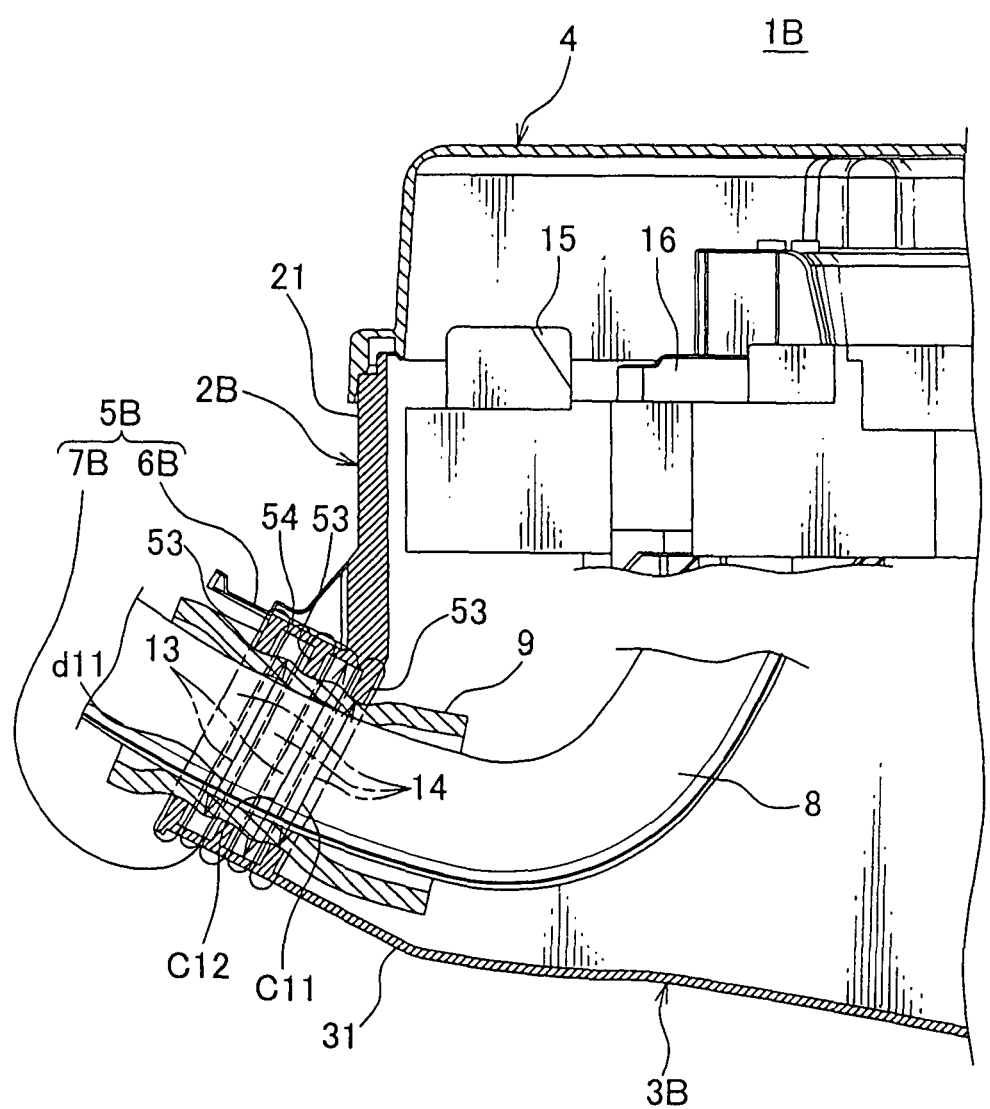
FIG. 3 is a cross-sectional view of an electric connection box of a second embodiment according to the present invention.
Figure 4:
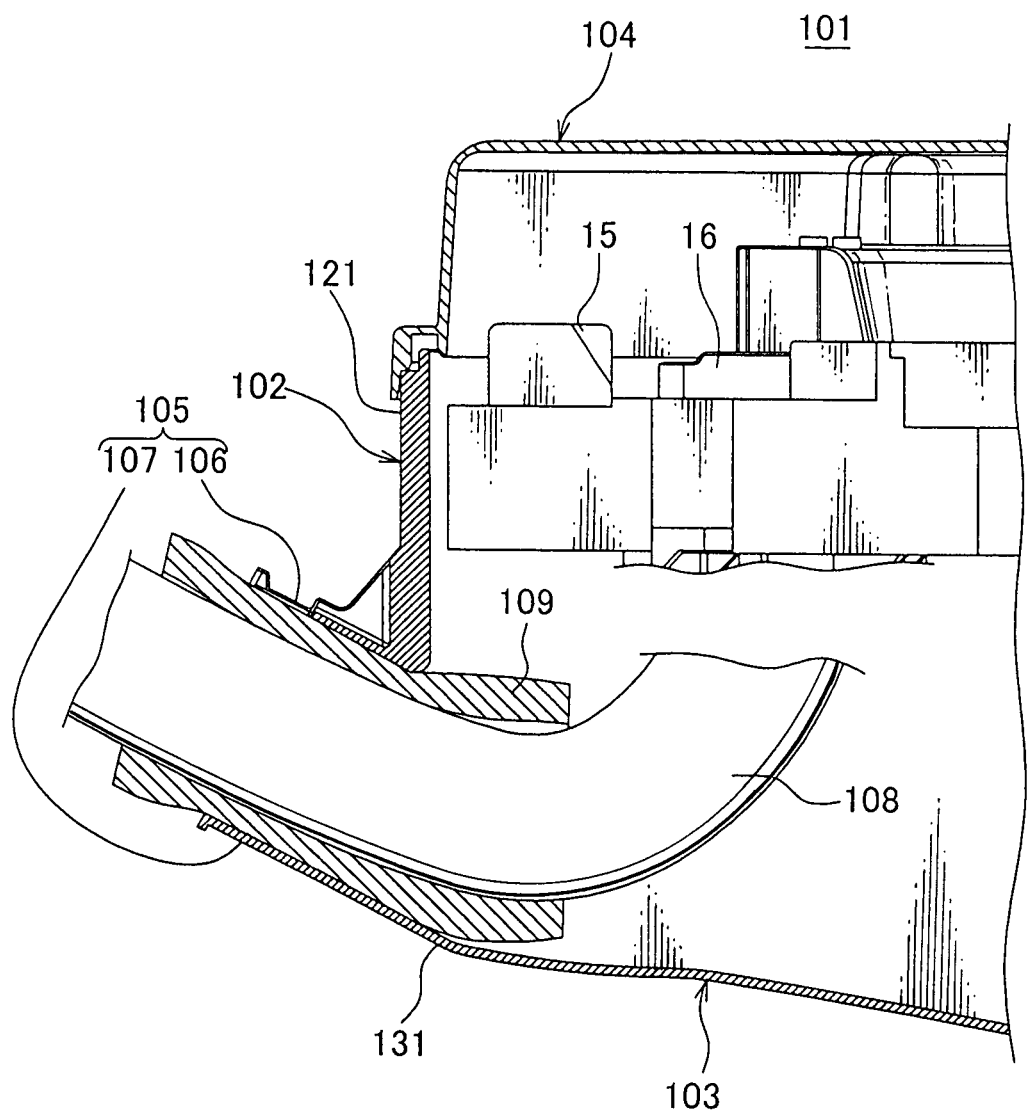
FIG. 4 is a cross-sectional view of an electric connection box by prior art.

An electric connection box of a second embodiment according to the present invention will be described with reference to FIG. 3. FIG. 3 is a cross-sectional view of the electric connection box of the second embodiment according to the present invention. With respect to FIG. 3, components same as the first embodiment mentioned above are put with the same marking and descriptions bout them will be omitted.

An electric connection box 1B as shown in FIG. 3 includes a case main body 2B, in which the various electric components 15, 16 are arranged; a lower cover 3B to be attached at a bottom side of the case main body 2B; an upper cover 4 to be attached at an upper side of the case main body 2B; a harness-through opening 5B to be structured into a cylindrical shape with the case main body 2B and the lower cover 3B when the lower cover 3B is attached to the case main body 2B; a wiring harness 8 to be passed through the harness-through opening 5B and a water-protect sheet 9 as an elastic sheet wound around the wiring harness 8 to be arranged in the harness-through opening 5B. The case main body 2B, the lower cover 3B and the upper cover 4 are made of synthetic resin by injection molding.

The harness-through opening 5B is structured with a projection 6B projecting with a half-cylindrical shape from a lower edge of the outer wall 21 of the case main body 2B, and a projection 7B projecting with a half-cylindrical shape from an upper edge of the outer wall 31 of the lower cover 3B, the outer wall 31 corresponding to the outer wall 21. When the lower cover 3B is attached on the case main body 2B, the projections 6B and 7B are overlapped to each other so as to form the harness-through opening 5B. The harness-through opening 5B communicates an outside of the case main body 2B and an inside of the case main body 2B.

The harness-through opening 5B has a large diameter portion 13 (shown by surrounding with a chain double-dashed line in FIG. 3), which has an inner diameter C12 larger than an outer diameter d11 of the part of the wiring harness 8 wound with the water-protect sheet 9, and a small diameter portion 14 (shown by surrounding with a dashed line in FIG. 3), which has an inner diameter C11 smaller than the outer diameter d11 of the part of the wiring harness 8 wound with the water-protect sheet 9. The outer diameter of the part of the wiring harness 8 wound with the water-protect sheet 9 correspond to an outer diameter of the wiring harness 8 added with thickness of the water-protect sheet 9.

The harness-through opening 5B includes a cylindrical portion 54 structuring the large diameter portion 13 and three ribs 53 projecting from an inner surface of the cylindrical portion 54 toward a center of the cylindrical portion 54 and extending along the cylindrical portion 54 so as to structure the small diameter portion 14. Three ribs 53 are arranged at intervals from each other. Thus, the cylindrical portion 54 is formed with the projections 6B, 7B, and the ribs 53 are arranged at the inner surfaces of the projections 6B, 7B. The large diameter portion 13 corresponds to a part other than the part in which the ribs 53 of the cylindrical portion 54 are arranged.

The three ribs 53 of the harness-through opening 5B structured above bite into the water-protect sheet 9 wound around the wiring harness 8 so as to press and deform the water-protect sheet 9 toward the center of the wiring harness 8. Thereby, the water-protect sheet 9 water-tightly seals a gap between the wiring harness 8 and the inner surface of the harness-through opening 5B, especially an inner surface of the small diameter portion 14.

As mentioned above, according to the present invention, by the part of the harness-through opening 5B biting the water-protect sheet 9, the gap between the wiring harness 8 and the harness-through opening 5B is sealed. Therefore, the small diameter portion 14, that is the rib 53, is dimensioned so as to bite the water-protect sheet 9 wound around the wiring harness 8.

The electric connection box 1B is assembled by arranging the part of the wiring harness 8 wound with the water-protect sheet 9 between the projections 6B, 7B, and attaching the lower cover 3B on the case main body 2B so as to clamp the part wound with the water-protect sheet 9 between the projections 6B, 7B.

According to the present invention mentioned above, only by the small diameter portion 14 biting the water-protect sheet 9, the gap between the wiring harness 8 and the harness-through opening 5B can be sealed. Thereby, the lower cover 3B can be attached to the case main body 2B with a small force.

According to the first and second embodiments mentioned above, the harness-through opening 5A, 5B is structured, for example, by the lower cover 3A, 3B. For structuring the harness-through opening, the upper cover also can be applied according to he present invention.

While, in the embodiment, the present invention is described, it is not limited thereto. Various change and modifications can be made with the scope of the present invention.

The invention claimed is:
1. An electric connection box, comprising:
a case main body;
a cover to be attached to the case main body;
a harness-through opening formed in the case main body as a cylindrical shape;
a wiring harness to be passed through the harness-through opening; and
an elastic sheet wound around the wiring harness and disposed along with the wiring harness in the harness-through opening,
wherein the harness-through opening forms a large diameter portion, which has an inner diameter larger than an outer diameter of a part of the wiring harness wound with the sheet, and a small diameter portion, which has an inner diameter smaller than the outer diameter of the part of the wiring harness wound with the sheet.

2. The electric connection box according to claim 1, wherein the harness-through opening comprises a cylindrical portion forming the large diameter portion and a slant portion arranged at an inner surface of the cylindrical portion, the slant portion slanting from an end of the cylindrical portion to the other end of the cylindrical portion to approach gradually toward a center of the cylindrical portion so as to form the small diameter portion.

3. The electric connection box according to claim 1, wherein the harness-through opening comprises a cylindrical portion forming the large diameter portion, and a rib projecting from an inner surface of the cylindrical portion toward a center of the cylindrical portion and extending along the cylindrical portion so as to form the small diameter portion.

* * * * *